United States Patent
Bailey, III et al.

(10) Patent No.: US 6,302,966 B1
(45) Date of Patent: Oct. 16, 2001

(54) TEMPERATURE CONTROL SYSTEM FOR PLASMA PROCESSING APPARATUS

(75) Inventors: Andrew D. Bailey, III, Pleasanton; Alan M. Schoepp, Ben Lomond; Michael G. R. Smith, Alameda; Andras Kuthi, Thousand Oaks, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/439,675

(22) Filed: Nov. 15, 1999

(51) Int. Cl.$^7$ .................................................. C23C 16/46
(52) U.S. Cl. ........................ 118/724; 118/712; 118/715; 118/719
(58) Field of Search ................... 118/723 R, 712, 118/715, 500, 724, 725, 719, 723 E; 204/298.06, 298.25, 298.35; 216/37, 67, 68; 156/345; 438/729, 695, 715, 96, 97; 136/203; 219/496, 516; 427/535, 569, 8

(56) References Cited

U.S. PATENT DOCUMENTS

| | | | |
|---|---|---|---|
| 4,690,793 | * 9/1987 | Hitachi, Ltd. et al. | 376/136 |
| 4,948,458 | 8/1990 | Ogle | 438/729 |
| 4,990,229 | 2/1991 | Campbell et al. | 204/298.06 |
| 5,091,049 | 2/1992 | Campbell et al. | 216/37 |
| 5,122,251 | 6/1992 | Campbell et al. | 204/298.06 |
| 5,242,264 | * 9/1993 | Kojima et al. | 415/200 |
| 5,356,661 | * 10/1994 | Doi et al. | 427/124 |
| 5,421,891 | 6/1995 | Campbell et al. | 118/723 R |
| 5,429,070 | 7/1995 | Campbell et al. | 118/723 R |
| 5,587,038 | 12/1996 | Cecchi et al. | 156/345 |
| 5,788,799 | * 8/1998 | Steger et al. | 156/345 |
| 5,885,356 | * 3/1999 | Zhao et al. | 118/723 R |
| 6,063,199 | * 5/2000 | Sajoto et al. | 118/715 |
| 6,165,271 | * 12/2000 | Zhao et al. | 118/715 |

FOREIGN PATENT DOCUMENTS

| | | |
|---|---|---|
| 0 819 780 A2 | 1/1998 | (EP) . |
| 0 837 489 A2 | 4/1998 | (EP) . |
| 0 838 842 A2 | 4/1998 | (EP) . |
| 0 838 843 A2 | 4/1998 | (EP) . |
| 61-104291 | * 5/1986 | (JP) .................................. G21B/1/00 |

OTHER PUBLICATIONS

Y. Fujiwara et al, "Temperature control of plasma grid for continuous operation in cesium–seeded volume negative ion source", Rev. Sci. Inst. 69 (2), 2.98, pp. 1173–1175.*

Mizuhara et al, "Ceramic/Metal Seals", Engineering Materials Handbook, 11.95, pp. 502–510.*

D.R. White et al, "Low temperature etch chuck: Modeling and experimental results of heat transfer and wafer temperature", J. Vac. Sci. Technol. A 10 (4), 7.92, pp. 1065–1070.*

* cited by examiner

*Primary Examiner*—Gregory Mills
*Assistant Examiner*—Rudy Zerrigon
(74) *Attorney, Agent, or Firm*—Beyer Weaver & Thomas, LLP

(57) ABSTRACT

A plasma processing system that includes a temperature management system and method that can achieve very accurate temperature control over a plasma processing apparatus is disclosed. In one embodiment, the temperature management system and method operate to achieve tight temperature control over surfaces of the plasma processing apparatus which interact with the plasma during fabrication of semiconductor devices. The tight temperature control offered by the invention can be implemented with combination heating and cooling blocks such that both heating and cooling can be provided from the same thermal interface.

26 Claims, 13 Drawing Sheets

TEMPERATURE CONTROL SYSTEM FOR PLASMA PROCESSING APPARATUS

CROSS-REFERENCE TO RELATED CASES

This application claims the benefit of U.S. Provisional Application No. 60/165,496 entitled "PROCESSING CHAMBER WITH TEMPERATURE CONTROL", filed concurrently herewith and incorporated herein by reference. This application is also related to the following concurrently filed U.S. Patent Applications:

i) application Ser. No.: 09/439,661 entitled "IMPROVED PLASMA PROCESSING SYSTEMS AND METHODS THEREFOR".

ii) application Ser. No.: 09/470,236 entitled "PLASMA PROCESSING SYSTEM WITH DYNAMIC GAS DISTRIBUTION CONTROL";

iii) application Ser. No.: 09/440,418 entitled "METHOD AND APPARATUS FOR PRODUCING UNIFORM PROCESS RATES", iv) application Ser. No.: 09/440,794 entitled "MATERIALS AND GAS CHEMISTRIES FOR PLASMA PROCESSING SYSTEMS", v) application Ser. No.: 09/439,759 entitled "METHOD AND APPARATUS FOR CONTROLLING THE VOLUME OF PLASMA", Each of the above-identified patent applications is incorporated herein by reference.

BACKGROUND OF THE INVENTION

1. Field of the Invention

The present invention relates to fabrication of semiconductor integrated circuits and, more particularly, to temperature control of plasma processing systems.

2. Description of the Related Art

In the fabrication of semiconductor-based devices, e.g., integrated circuits or flat panel displays, layers of materials may alternately be deposited onto and etched from a substrate surface. During the fabrication process, various layers of material, e.g., borophosphosilicate glass (BPSG), polysilicon, metal, etc. are deposited on the substrate. The deposited layers may be patterned with known techniques, e.g., a photoresist process. Thereafter, portions of the deposited layers can be etched away to form various features, e.g., interconnect lines, vias, trenches, and etc.

The process of etching may be accomplished by a variety of known techniques, including plasma-enhanced etching. In plasma-enhanced etching, the actual etching typically takes place inside a plasma processing chamber. To form the desired pattern on the substrate wafer surface, an appropriate mask (e.g., a photoresist mask) is typically provided. With the substrate wafer in the plasma processing chamber, a plasma is then formed from suitable etchant source gas (or gases). The plasma is used to etch areas that are left unprotected by the mask, thereby forming the desired pattern. In this manner, portions of deposited layers are etched away to form interconnect lines, vias, trenches, and other features. The deposition and etching processes may be repeated until the desired circuit is obtained.

To facilitate discussion, FIG. 1 depicts a simplified plasma processing apparatus 100 suitable for fabrication of semiconductor-based devices. The simplified plasma processing apparatus 100 includes a plasma processing chamber 102 having an electrostatic chuck (ESC) or other wafer support 104. The chuck 104 acts as an electrode and supports a wafer 106 (i.e., substrate) during fabrication. The surface of the wafer 106 is etched by an appropriate etchant source gas that is released into the wafer processing chamber 102. The etchant source gas can be released through a showerhead 108. The plasma processing source gas may also be released by other mechanisms such as through holes in a gas distribution plate. A vacuum plate 110 maintains a sealed contact with walls 112 of the wafer processing chamber 102. Coils 114 provided on the vacuum plate 110 are coupled to a radio frequency (RF) power source (not shown) and used to strike (ignite) a plasma from the plasma processing source gas released through the showerhead 108. The chuck 104 is also typically RF powered during the etch processes using a RF power supply (not shown). A pump 116 is also included to draw the process gases and gaseous products from the plasma processing chamber 102 through a duct 118.

As is known by those skilled in the art, in the case of semiconductor processing, such as etch processes, a number of parameters within the wafer processing chamber need to be tightly controlled to maintain high tolerance results. The temperature of the wafer processing chamber is one such parameter. Since the etch tolerance (and resulting semiconductor-based device performance) can be highly sensitive to temperature fluctuations of components in the system, accurate control therefore is required. To further elaborate, the chamber temperature at which etching processes are performed needs to be tightly controlled to achieve desirable etch characteristics. Moreover, as feature sizes of modern integrated circuits continue to be reduced, it becomes increasingly more difficult to process the desired features using conventional plasma processing systems.

In plasma processing apparatus, plasma formed by excited process gasses is used to manufacture semiconductor devices, the excitation of the process gasses to produce the plasma is a high energy operation that causes heating of various components of the plasma processing apparatus. This heating effects the precision and repeatability of the processes performed by the plasma processing device. As feature sizes continue to get smaller, there is an ever increasing need to provide plasma processing apparatus with better temperature control in order to provide consistent and precise fabrication of semiconductor devices.

Conventionally, heating has been provided to plasma processing chambers by providing the plasma processing chambers with heated inner walls or by heating the plasma processing chamber using small heat lamps. Heating is typically used to pre-heat the plasma processing chamber before processing begins. Cooling was often not actively provided, thus cooling was simply passive through convection and radiation. Typically, these thermal solutions were designed for aluminum liners of plasma processing chambers and thus are not well suited for heating or cooling ceramic liners which is a more difficult task. Aluminum lines also lead to significant contamination which is why ceramic liners are considered.

In view of foregoing, there is a need for improved plasma processing systems that provide better temperature control over semiconductor processing equipment.

SUMMARY OF THE INVENTION

Broadly speaking, the invention pertains to a temperature management system and method that can achieve very accurate temperature control over a plasma processing apparatus. In one embodiment, the temperature management system and method operate to achieve tight temperature control over surfaces of a plasma processing apparatus which interact with the plasma during fabrication of semiconductor devices. The tight temperature control offered by the invention provides greater process control for the plasma processing apparatus which is becoming more and more important as feature sizes continue to get smaller.

The invention can be implemented in numerous ways, including as a system, apparatus, machine, or method. Several embodiments of the invention are discussed below.

As a plasma processing apparatus, one embodiment of the invention includes at least: a processing chamber having walls and a lid, the walls and the lid both have an internal surface and an exterior surface, the processing chamber being used to process a substrate using a plasma produced by process gases; and a thermal management system thermally coupled to an exterior surface of the processing chamber, the thermal management system including at least one combination heating and cooling block that is controlled to regulate a temperature internal to the processing chamber.

As a semiconductor manufacturing apparatus, one embodiment of the invention includes at least: a plasma processing chamber formed by walls and a bottom surface; a sealing lid removably coupled to a top portion of the walls of the plasma processing chamber; an RF powered electrode provided on an upper surface of the sealing lid; at least one temperature sensor coupled to the sealing lid or the plasma processing chamber; a first heating and cooling unit coupled to the upper surface of the sealing lid; and a second heating and cooling unit coupled to an outer surface of the walls of the plasma processing chamber.

As a method for providing temperature control to a plasma processing chamber of a plasma processing apparatus, the method includes at least the acts of: directly or indirectly measuring temperature internal to the plasma processing chamber; comparing the measured temperature to a target temperature; heating the plasma processing chamber by heating a thermal control block that is thermally coupled to the plasma processing chamber; and cooling the plasma processing chamber by actively cooling the thermal control block.

As a plasma processing apparatus, another embodiment of the invention includes at least: a processing chamber having walls and a lid, the walls and the lid both have an internal surface and an exterior surface, the processing chamber being used to process a substrate using a plasma produced by process gases; and means for regulating a temperature internal to the processing chamber by heating the processing chamber with a heater element when the internal temperature is below a lower target temperature and cooling the processing chamber, through the heater element, with a cooling element when the internal temperature is above an upper target temperature.

As a combination heating and cooling block, according to yet another embodiment of the invention, the combination heating and cooling block has a sandwich construction and includes at least a heater element, a cooling element, and a thermal break element between the heater element and the cooling element.

The advantages of the invention are numerous. Different embodiments or implementations may yield one or more of the following advantages. One advantage of the invention is that the invention allows temperature of plasma processing devices to be controlled with substantially decreased drift. Another advantage of the invention is that the temperature of the plasma processing devices can be controlled with increased accuracy to enable better device to device matching. Another advantage of the invention is that both heating and cooling are provided through a common thermal interface. Still another advantage of the invention is that by using a common thermal interface, not only can both cooling and heating be provided, but the resulting temperature profile of the surface being temperature controlled is uniform and smooth. Also the temperature profile of the surface being temperature controlled can be invariant in space and time during the transients caused by wafer processing. Yet another advantage of the invention is that it is non-invasive and easily removable.

Other aspects and advantages of the invention will become apparent from the following detailed description, taken in conjunction with the accompanying drawings illustrating, by way of example, the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to a temperature management system and method that can achieve very accurate and precise temperature control over a plasma processing apparatus. In one embodiment, the temperature management system and method operate to achieve tight temperature control over surfaces of a plasma processing apparatus which interact with the plasma during fabrication of semiconductor devices. The tight temperature control offered by the invention provides greater process control for the plasma processing apparatus which is becoming more and more important as feature sizes continue to get smaller.

In a plasma processing apparatus which uses plasma formed by excited process gasses to manufacture semiconductor devices, the excitation of the process gasses to produce the plasma is a high energy operation that causes heating of various components of the plasma processing apparatus. The invention pertains to a temperature management system and method that can achieve very accurate temperature control over a plasma processing apparatus. In one embodiment, the temperature management system and method operate to achieve tight temperature control over surfaces of the plasma processing apparatus which interact with the plasma used to fabricate the semiconductor devices.

In one implementation, the temperature control system includes a heating and cooling unit that is coupled to an outer surface of a plasma processing chamber of a plasma processing apparatus to be temperature controlled. The heating and cooling unit serves to couple heat into or away from (i.e., heat or cool) the surface being controlled through the same thermal interface.

Embodiments of the invention are discussed below with reference to FIGS. 2–11. However, those skilled in the art will readily appreciate that the detailed description given herein with respect to these figures is for explanatory purposes as the invention extends beyond these limited embodiments.

Figure 1:
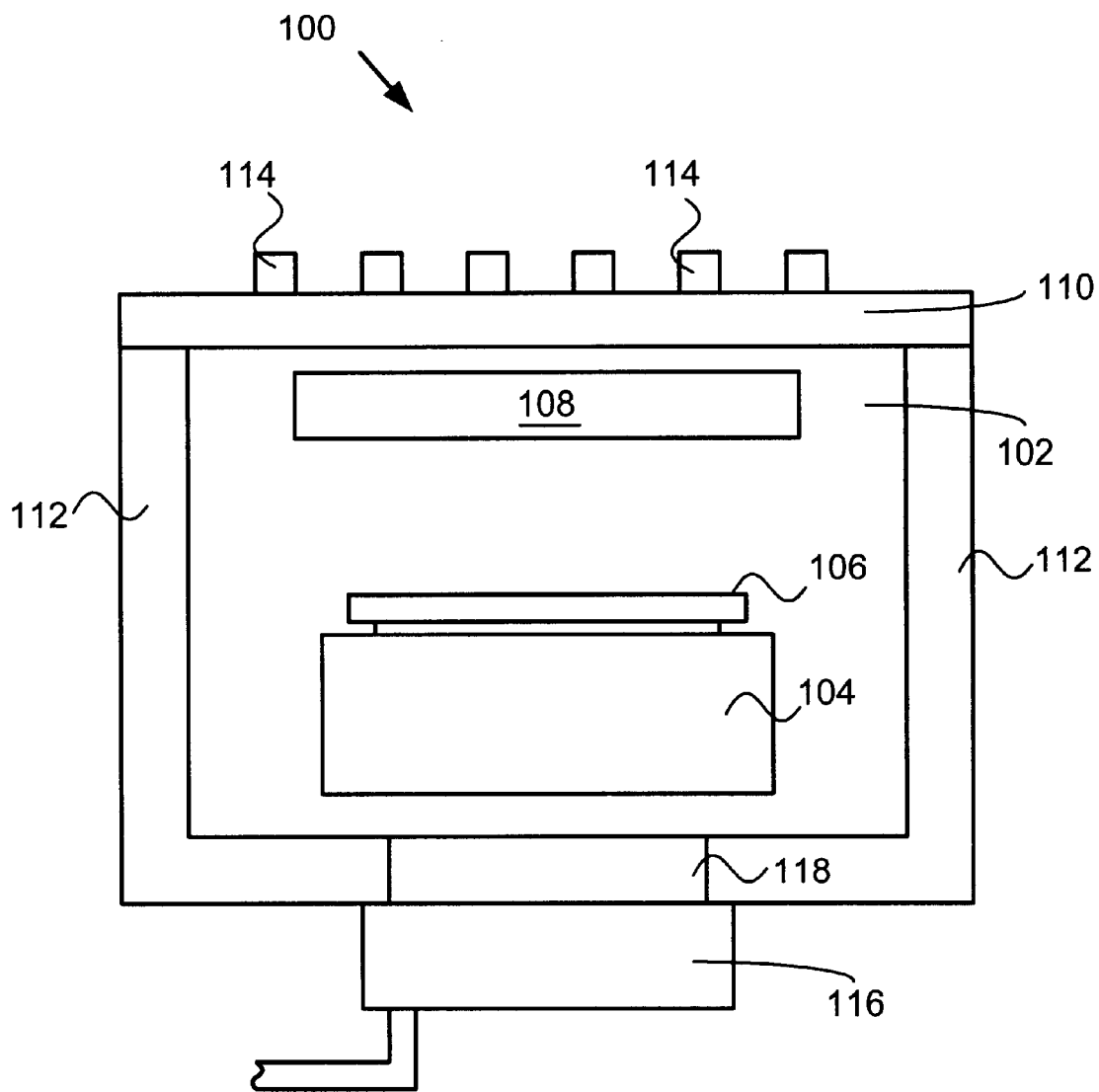
FIG. 1 depicts a simplified plasma processing apparatus suitable for fabrication of semiconductor-based devices.
Figure 2A:
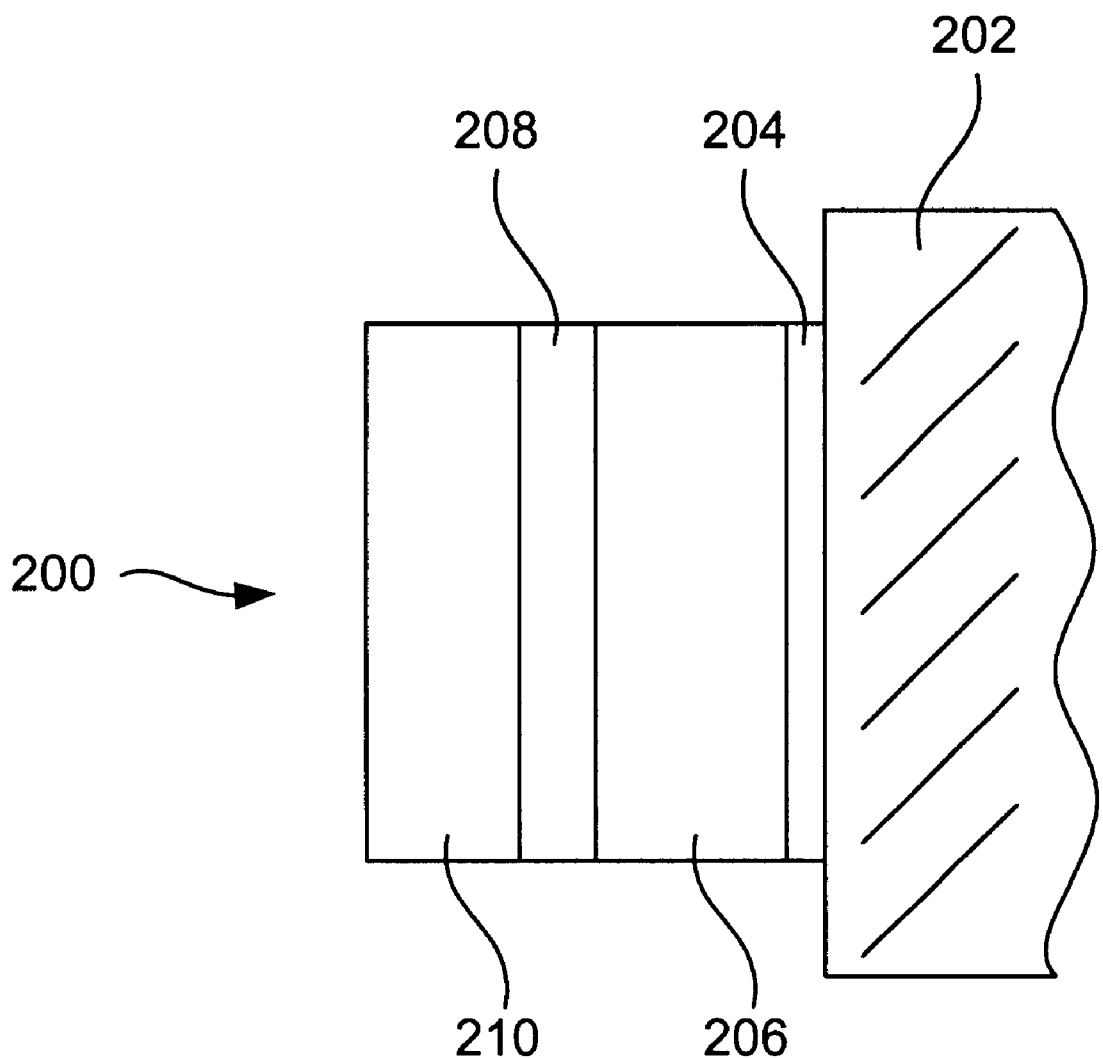
FIG. 2A illustrates a heating and cooling unit according to one embodiment of the invention.

FIG. 2A illustrates a heating and cooling unit 200 according to one embodiment of the invention. The heating and cooling unit 200 is used to heat or cool a surface 202. The surface 202 is assumed to be a surface that requires both heating and cooling. For example, the surface 202 could initially require heating then later require cooling. In any case, temperature of the surface 202 is required to be accurately and precisely controlled. The heating and cooling unit 200 as shown in FIG. 2A includes a conformal thermal interface 204, a heating block 206, a thermal break 208, and a cooling block 210. The conformal thermal interface is a thin layer of a material, such as metal-impregnated silicone rubber, which has a relatively high effective thermal coefficient because of the thinness of the layer and is easily conformable. Hence, the conformal thermal interface 204 provides high thermal coupling between the surface 202 and the heating block 206. The heating block 206 is able to generate heat that couples to the surface 202 through the conformal thermal interface 204. To generate the heat, the heating block 206 can include one or more resistive elements. The resistive elements can heat the heating block 206 through use of a controlled current or voltage. As an example, the heating block 206 is made of a metal material such as aluminum.

The thermal break 208 is sandwiched between the heating block 206 and the cooling block 210. The thermal break 208 is, for example, a silicone rubber substance. Typically, the thermal conductivity of the thermal break 208 is substantially less than the thermal conductivity of the conformal thermal interface 204 because of the thickness of the layer. The thermal break 208 serves to provide a transition region between the heating block 206 and the cooling block 210 so that both can be provided in the heating and cooling unit 200. The cooling block 210 is able to cool the surface 202 through the heating block 206 and the conformal thermal interface 204. The cooling block 210 is itself cooled with a cooling element. In one implementation, the cooling element is a temperature controlled liquid (e.g., water) that flows through the cooling block 210. The cooling block 210 can, for example, be made of metal, such as aluminum.

Figure 2B:
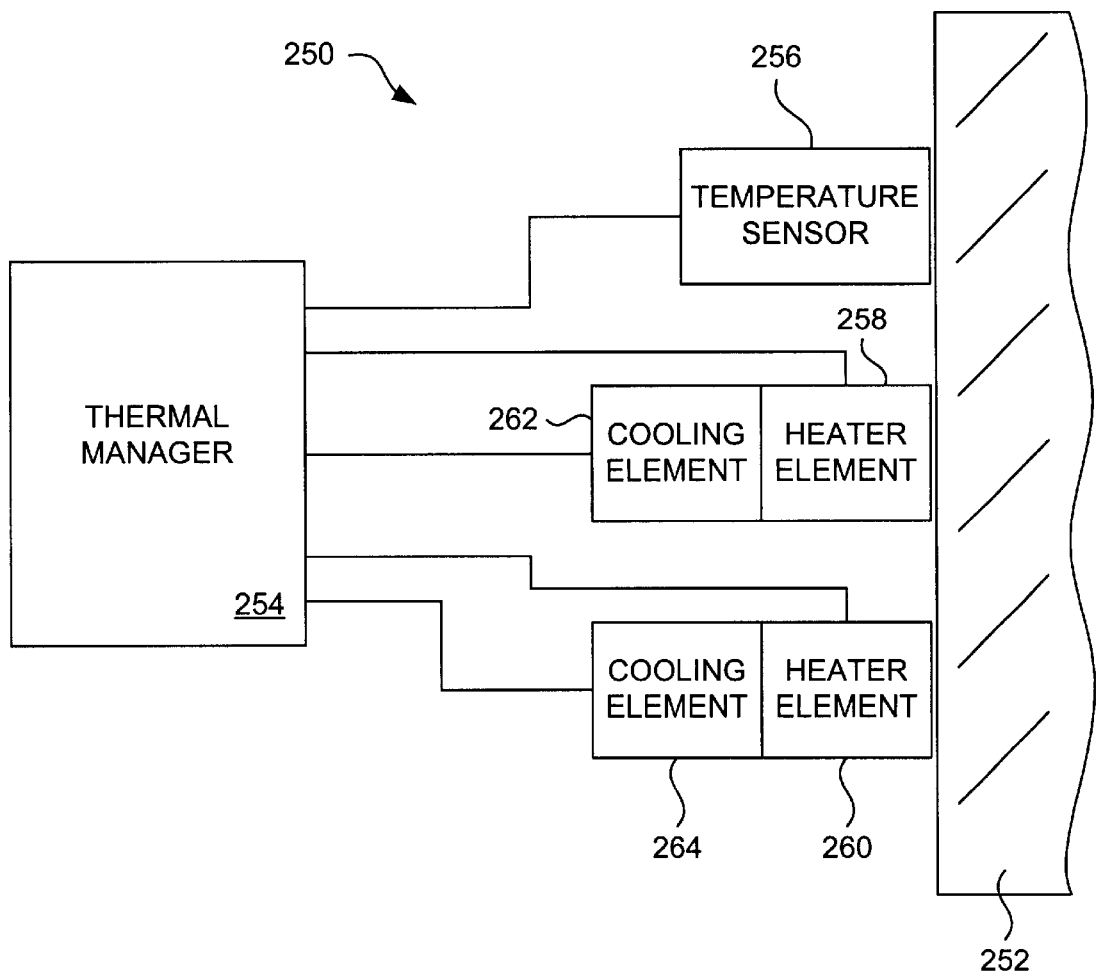
FIG. 2B is a block diagram of a temperature control system according to one embodiment of the invention.

FIG. 2B is a block diagram of a temperature control system 250 according to one embodiment of the invention. The temperature control system 250 operates to control the temperature of a surface 252. For example, the surface 252 can be associated with an external surface of a plasma processing chamber of a plasma processing apparatus.

The temperature control system 250 includes a thermal manager 254 that controls the overall operation of the temperature control system 250 so that the surface 252 is maintained at a suitable temperature. The thermal manager 254 is able to control both heating and cooling of the surface 252 as needed to maintain the desired temperature. The thermal manager 254 obtains a temperature of the surface 252 from a temperature sensor 256 that is coupled to the surface 252. In accordance with the temperature obtained from the temperature sensor 256, the thermal manager 254 determines whether the surface 252 requires heating or cooling. When the thermal manager 254 determines that the surface 252 requires heating, the thermal manager 254 can activate a heater element 258 and a heater element 260. Typically, the heater elements 258 and 260 are simultaneously activated to heat the surface 252 in a similar manner. On the other hand, when the thermal manager determines that the surface 252 requires cooling, the thermal manager 254 can activate a cooling element 262 and a cooling element 264. Typically, the cooling elements 262 and 264 are simultaneously activated to cool the surface 252 in a similar manner. As shown in FIG. 2B, the cooling elements 262 and 264 are coupled to the surface 252 through the heating elements 258 and 260, respectively. By coupling the cooling elements to the surface 252 through the heater elements 258 and 260, a smoother spatial and temporal temperature profile can be provided to the surface 252, thereby producing a more uniform temperature profile at the surface 252.

Typically, when the heater elements 258 and 260 are activated, the cooling elements 262 and 264 are not activated and, when the cooling elements 262 and 264 are activated, the heater elements 258 and 260 are deactivated. Nevertheless, in some situations, it may be useful to have respective heating and cooling elements both activated at the same time. In one embodiment, the combination of the heater element 258 and the cooling element 262 and the combination of the heater element 260 and the cooling element 264 can be constructed as is the heating and cooling unit 200 illustrated in FIG. 2A.

Figure 3:
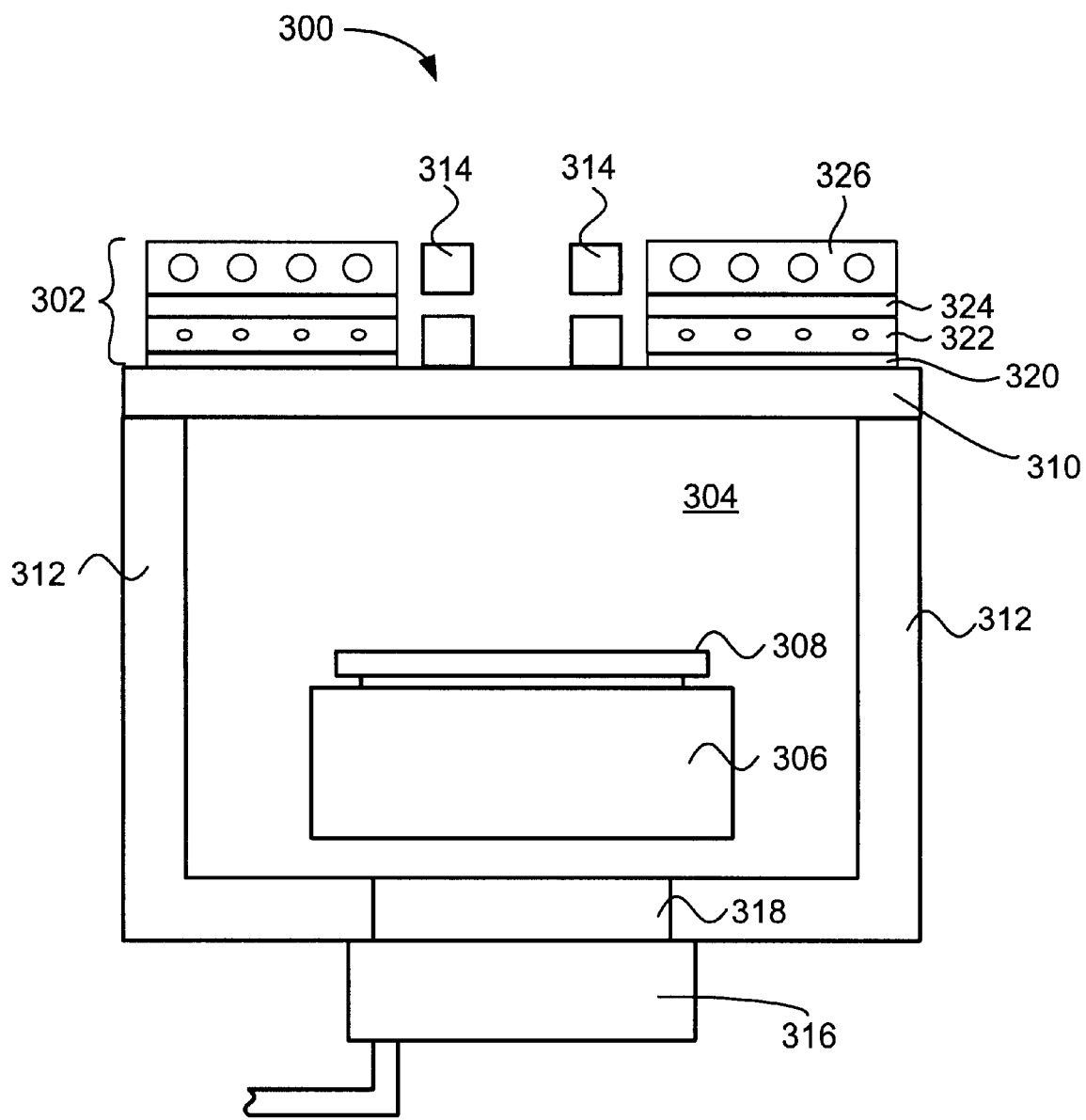
FIG. 3 is a cross-sectional diagram of a plasma processing apparatus according to one embodiment of the invention.

FIG. 3 is a cross-sectional diagram of a plasma processing apparatus 300 according to one embodiment of the invention. The plasma processing apparatus 300 includes a heating and cooling plate 302 that is thermally coupled to a plasma processing chamber 304. The plasma processing chamber 304 has a wafer holding mechanism 306 to support a wafer 308 (i.e., substrate) during fabrication. As an example, the wafer holding mechanism 306 can be an electrostatic chuck (ESC). The surface of the wafer 308 is etched by an appropriate plasma processing source gas that is released into the wafer processing chamber 304. The plasma processing source gas can be released by a variety of mechanisms, including a showerhead or a gas distribution plate. A vacuum plate 310 maintains a sealed contact with walls 312 of the plasma processing chamber 304. Coils 314 provided on the vacuum plate 310 are coupled to a radio frequency (RF) power source (not shown) and used to strike (ignite) a plasma from the plasma processing source gas released into the plasma processing chamber 304. The wafer holding mechanism 306 is also often RF powered during the etch processes using a RF power supply (not shown). A pump 316 is also included to draw the process gases and gaseous products from the plasma processing chamber 304 through a duct 316.

The heating and cooling plate 302 operates to control the temperature of the vacuum plate 310 of the plasma processing apparatus 300 such that the inner surface of the vacuum plate 310, which is exposed to the plasma during operation, is maintained at a controlled temperature. The heating and cooling plate 302 is formed by several different layers of material to provide both heating and cooling operations. More particularly, the heating and cooling plate 302 includes a thermal gasket 320 that couples directly against the vacuum plate 310. The thermal gasket 320 is a soft material that provides a conformal thermal interface with respect to the outer surface of the vacuum plate 310. The heating and cooling plate 302 also includes a heater block 322 that is provided over the thermal gasket 320. The heater block 322 includes resistive elements that heat the heater block 322 when they are supplied with electrical current. A thermal break 324 is provided over the heater block 322. The thermal break 324 provides a thermal separation zone between a hot and cold surface. Over the thermal break 324 is a cooling block 326. The cooling block 326 includes a plurality of cooling elements that serve to cool the cooling block 326. Accordingly, the heating and cooling plate 302 can be viewed as a sandwich structure including the thermal gasket 320, the heater block 322, the thermal break 324, and the cooling block 326. Accordingly, the temperature of the vacuum plate 310 can be controlled through the activation of either the heater elements of the heater block 322 or the cooling elements of the cooling block 326.

Figure 4:
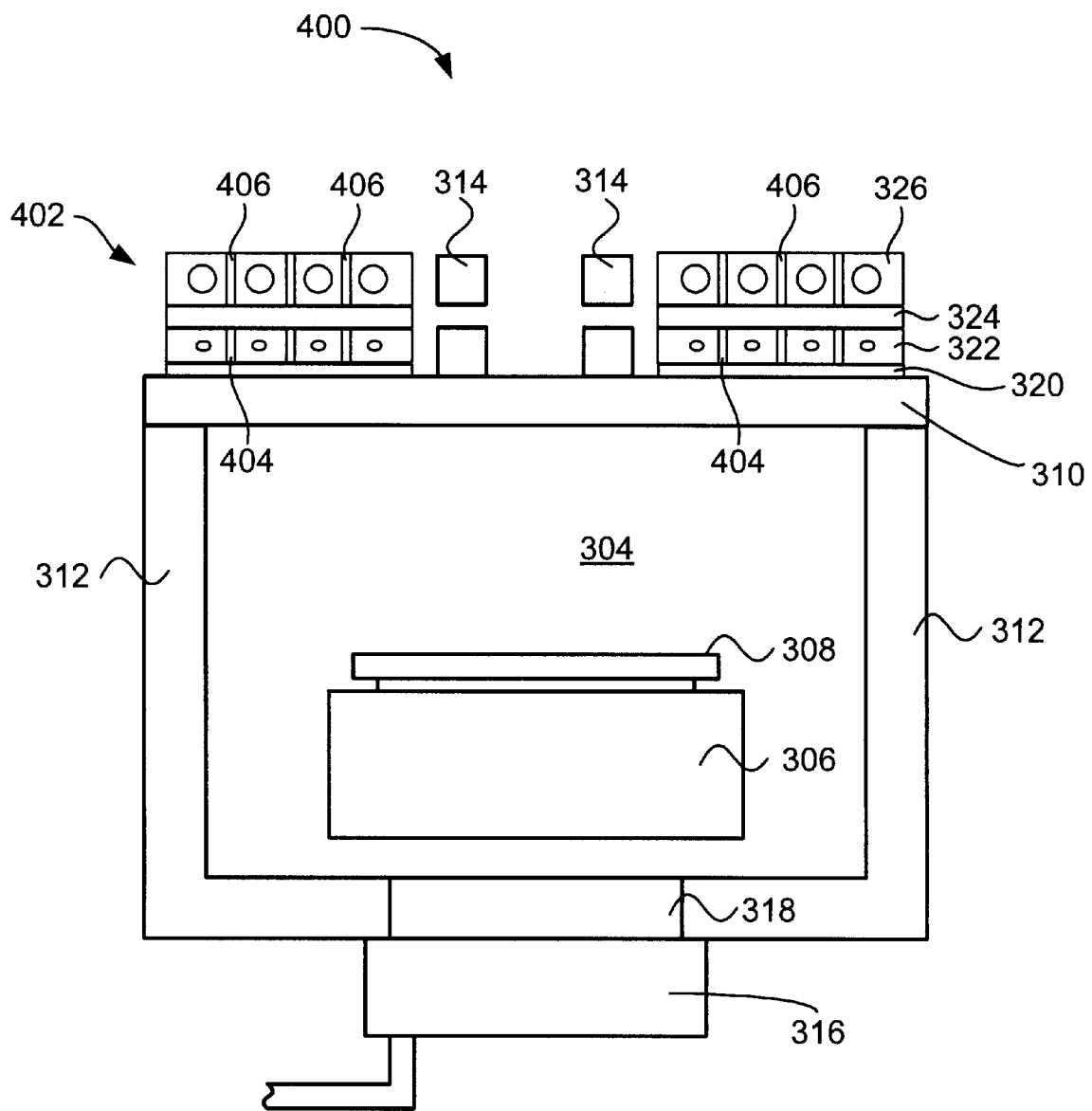
FIG. 4 is a cross-sectional diagram of a plasma processing apparatus according to another embodiment of the invention.

FIG. 4 is a cross-sectional diagram of a plasma processing apparatus 400 according to another embodiment of the invention. The plasma processing apparatus 400 is similar to the plasma processing apparatus 300 illustrated in FIG. 3. The plasma processing apparatus 400 includes a heating and cooling plate 402 that couples against the vacuum plate 310. The heating and cooling plate 402 is similar to the heating and cooling plate 302 illustrated in FIG. 3 in that is includes a sandwich structure including the thermal gasket 320, the heating block 322, the thermal break 324, and the cooling block 326. In addition, the heating and cooling plate 402 includes notches 404 in the heater block 322 and notches 406 in the cooling block 326. Given that the heating and cooling plate 402 is located proximate to the RF coils 314 that serve to activate the plasma within the plasma processing chamber 402, a large amount of radio frequency (RF) energy can surround the RF coils 314. As a result, the notches 404 and 406 provided in the heater block 322 and the cooler block 326, respectively, serve to substantially prevent coupling of the RF energy from the RF coils 314 to either or both the heater block 322 or the cooler block 326. More particularly, the RF coils 314 can induce circulating currents in the heater block 322 or the cooler block 326 if a conductive loop encircling the RF coils 314 is provided to facilitate the coupling of the electromagnetic energy. In addition, eddy currents that do not encircle the RF coils 314 can also couple energy depending on their area and proximity to the RF coils 314. However, the notches (or slots) provided in the heater block 322 and the cooler block 326 serve to avoid the presence of conductive loops that would serve to receive coupled energy from the RF coils 314 and to reduce the area for eddy currents. As such, the notches 404 and 406 prevent the RF energy from coupling into the heating and cooling plate 402. Potentially, the RF energy, if it were allowed to couple to the heating and cooling plate 402, would serve to damage the heating and cooling plate 402, interfere with the temperature control, reduce the power available to generate plasma and/or require other costly measures to be taken to minimize the RF coupling.

Figure 5:
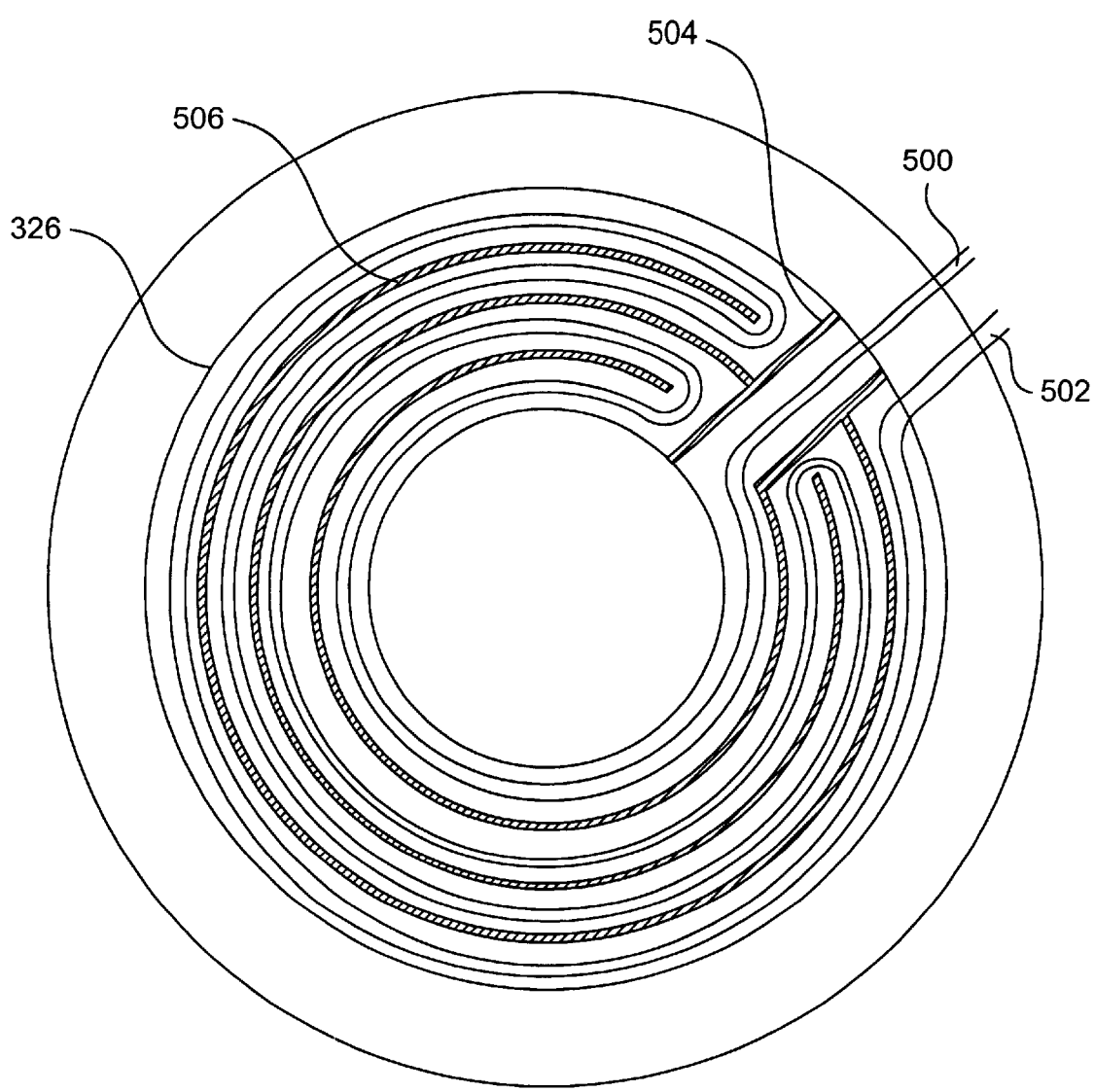
FIG. 5 is a top view of a cooling block provided on a vacuum plate as provided by the plasma operating apparatus illustrated in FIG. 4 according to one embodiment.

FIG. 5 is a top view of the cooling block 326 provided on the vacuum plate 310 as provided by the plasma operating apparatus 400 illustrated in FIG. 4 according to one embodiment. The cooling block 326 includes cooling elements that are provided by a cooling tube that circulates through the cooling block 326. In FIG. 5, the cooling tube has an inlet 500 and an outlet 502 for the cooling liquid. In this embodiment, the cooling liquid can be water (i.e., $H_2O$) which is a safe and inexpensive liquid, but other fluids could also be used. The cooling elements are thus provided by the single cooling tube that circulates through the cooling block 326. As illustrated in FIG. 5, a single cooling tube can be utilized to provide the cooling elements. In other words, in this embodiment, different portions of a cooling tube provided within the cooling block 326 can implement the cooling elements.

In addition, the cooling block 326 also includes cuts 504 and 506 that implement the notches 404 and 406 illustrated in FIG. 4. The patterning of the cuts 504 and 506 serves to prevent conductive loops in the cooling block 326 that would serve to receive RF energy from the coils 314. In other words, the cuts 504 and 506 are formed in the cooling block 326 to prevent, or at least substantially reduce, any coupling of RF energy into the cooling block 326 of the heating and cooling plate 302.

While FIG. 5 illustrates a particular pattern for the cooling elements and the cuts 504 and 506 of the cooling block 326, those skilled in the art will recognize that alternative cooling elements and notches can be utilized. For example, the cooling element could be provided by multiple flow paths instead of a single inlet and outlet for a cooling liquid. Further, the cooling elements and notches (cuts) could be arranged differently to achieve a similar effect by using radial patterns.

While FIG. 5 depicts the cooling plate 326 having the cuts 504 and 506 to substantially reduce any RF coupling from the coils 314, the heating plate 322 can similarly be patterned with cuts to prevent conductive loops in the heating block 322 that would serve to receive RF energy from the coils 314. Further, in one embodiment, the cuts in the heating block 322 are patterned the same and positioned over the cuts 504 and 506 of the cooling plate 326, though separated by the thermal break 324.

Moreover, although FIGS. 3–5 do not illustrate the providing of heating or cooling components on the vacuum plate 310 internal to the RF coils 314, it should be noted that a smaller heating and cooling plate could be provided internal to the RF coils to provide additional heating and cooling. Such a heating and cooling plate could be arranged and utilized in a similar manner as the heating and cooling plate 302, 402.

Figure 6:
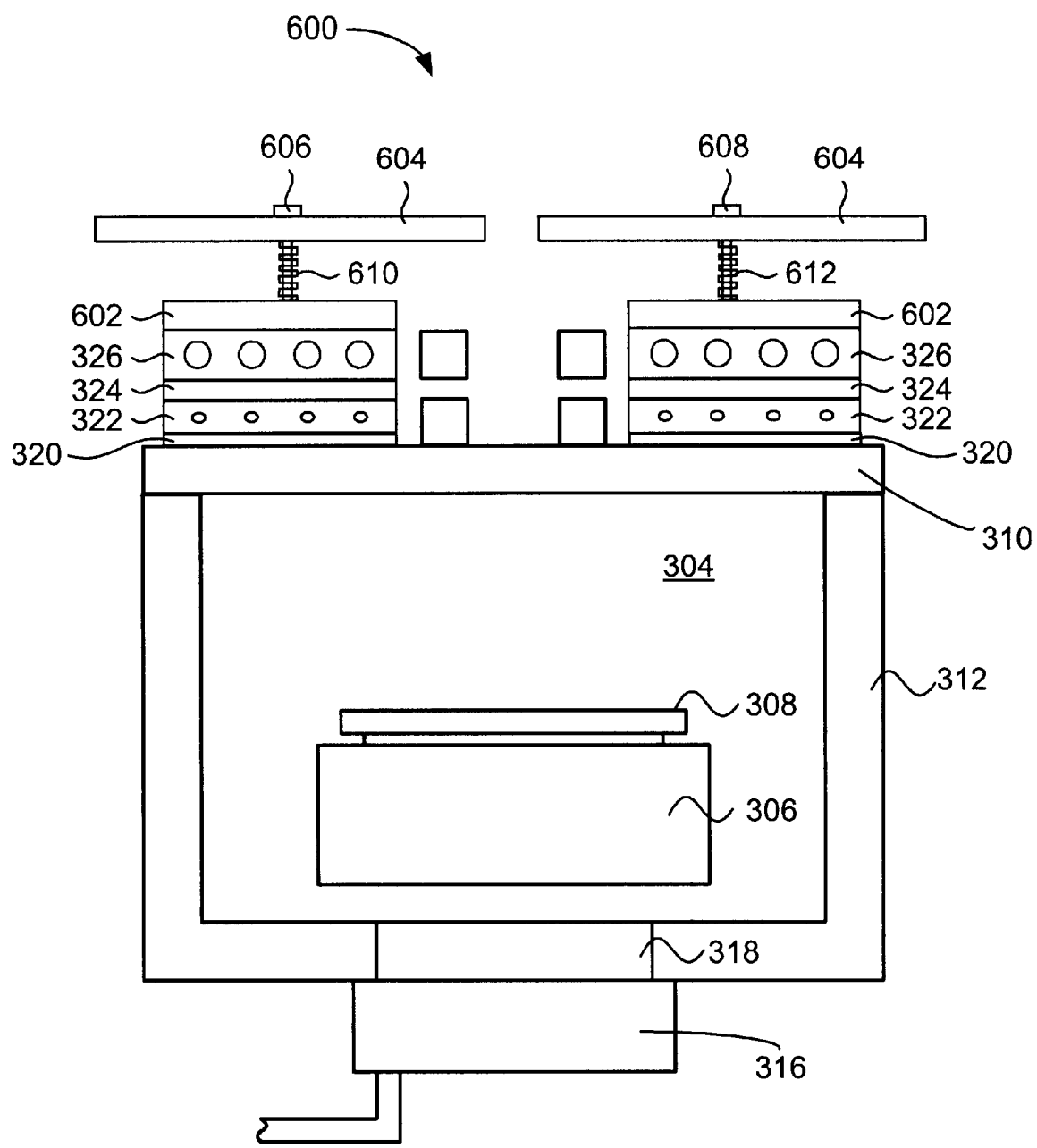
FIG. 6 illustrates a cross-sectional diagram of a plasma processing apparatus according to another embodiment of the invention.

FIG. 6 illustrates a cross-sectional diagram of a plasma processing apparatus 600 according to another embodiment of the invention. The plasma processing apparatus 600 is similar to the plasma processing apparatus 300 illustrated in FIG. 3 or the plasma processing apparatus 400 illustrated in FIG. 4. However, in addition, the plasma processing apparatus 600 includes a cover plate 602 that is provided over the cooling block 326 of the heating and cooling block 302, 402. The cover plate 602 is, for example, made of nylon.

In addition, a support plate 604 having a rigid position can be used to hold the heating and cooling plate 302, 402 in proper position against the vacuum plate 310, yet allow the heating and cooling plate 302, 402 to be removed for maintenance or reconfiguration of the plasma process apparatus 600. The plasma processing apparatus 600 includes pins 606 and 608 that guide springs 610 and 612 with respect to the support plate 604. The springs 610 and 612 serve to press against the cover plate 602 to bias the heating and cooling plate 302, 402 against the outer surface of the vacuum plate 310. Hence, the support plate 604, the pins 606 and 608, and the springs 610 and 612 cooperate to hold the heating and cooling plate 302, 402 in good thermal contact with the outer surface of the vacuum plate 310. Further, the heating and cooling plate 302, 402 can be removed from the vacuum plate 310 with minimal effort by retracting the pins 606 and 608 and withdrawing the heating and cooling plate 302, 402. The easy removeability of the heating and cooling plate 302, 402 allow rapid repair, maintenance or reconfiguration and yet allow reassembly for consistent positional and thermal contact.

Figure 7:
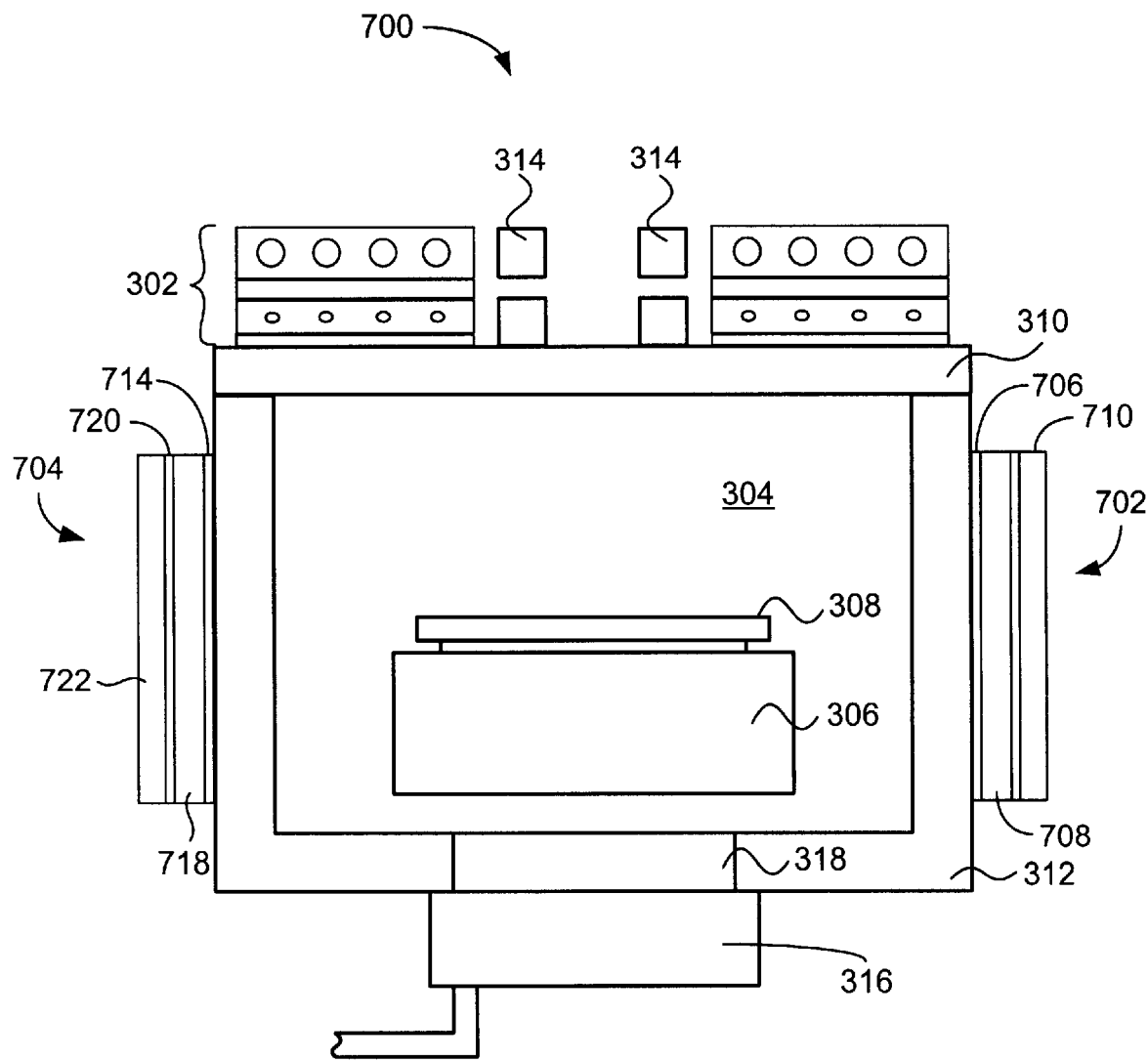
FIG. 7 is a cross-sectional diagram of a plasma processing apparatus according to yet another embodiment of the invention.

FIG. 7 is a cross-sectional diagram of a plasma processing apparatus 700 according to yet another embodiment of the invention. The plasma processing apparatus 700 is similar to the plasma processing apparatus 300 illustrated in FIG. 3, but further includes a plurality of side-wall heating and cooling units. In FIG. 7, two of a plurality of side-wall heating and cooling units 702 and 704 are illustrated. Typically, the heating and cooling units will be provided around the periphery of the processing chamber in a uniform manner such as described below with respect to FIG. 9.

The side-wall heating and cooling unit 702 includes a thermal gasket 706, a heater block 708, a thermal break 710, and a cooling block 712. Similarly, the side-wall heating and cooling unit 704 includes a thermal gasket 714, a heater block 718, a thermal break 720, and a cooling block 722. Accordingly, the heating and cooling units 702 and 704 have an arrangement similar to the heating and cooling block 200 illustrated in FIG. 2A. The heating and cooling elements 702 and 704 thermally couple against an outer surface of the side walls of the plasma processing chamber 304. The heating and cooling blocks 702 and 704 are controlled to either heat or cool the side walls of the plasma processing chamber 304, thereby controlling the temperature of the inner surface of the side walls of the plasma processing chamber 304.

Although FIG. 7 illustrates the heating and cooling plate 302 provided on the vacuum plate 310, it should be understood that the heating and cooling plate 302 is optional in this embodiment and that the plasma processing apparatus 700 may operate to provide the plurality of heating and cooling units coupled to the side walls of the plasma processing chamber 304 and may or may not include the heating and cooling plate 302 coupled to the vacuum plate 310. Nevertheless, if the heating and cooling plate 302 is provided with the plasma processing apparatus 700, the heating and cooling plate 302 can also include notches 404 and 406 or the support plate 604, the pins 606 and 608 and the springs 610 and 612 (see FIGS. 4 and 6).

Figure 8A:
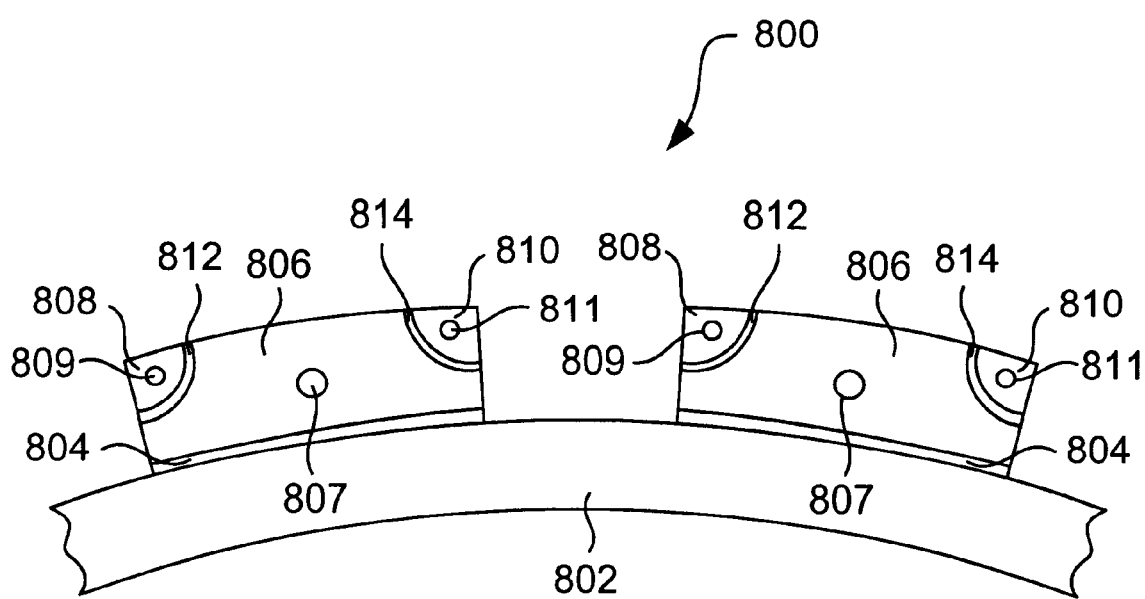
FIG. 8A illustrates a portion of side wall heating and cooling system from a top view having two heating and cooling units thermally coupled to thereto.

While the heating and cooling unit 702 and 704 are generally designed in accordance with the heating and cooling block 200 illustrated in FIG. 2A, FIG. 8A illustrates a particular embodiment for the side-wall heating and cooling units 702 and 704.

FIG. 8A illustrates a portion of side wall heating and cooling system 800 from a top view. The heating and cooling system 800 acts to heat or cool an outer surface and, thus the inner surface, of a wall 802 of a plasma processing chamber. In this example, the plasma processing chamber has a circular design and thus the exemplary portion of the wall 802 is shown in FIG. 8A as having a curvature. FIG. 8A also illustrates two heating and cooling units thermally coupled to the exemplary portion of the wall 802. Each of the heating and cooling units is shown in FIG. 8A from a top, cross-sectional view. The heating and cooling units include a thermal gasket 804 that provides a thin conformal thermal interface. The thermal gasket thus provides good thermal coupling between the heating and cooling units and the outer surface of the wall 802. The heating and cooling units also include a heater block 806. Each of the heater blocks 806 includes a resistive element 807 that serves to heat the heater block 806 when a current is directed through the resistive element 807. The heating and cooling units also include a pair of cooling regions 808 and 810. These cooling regions respectively include cooling elements 809 and 811. As an example, the cooling elements 809 and 811 can pertain to a tube through which a cooled liquid flows. The heating and cooling units also include a thermal break 812 between the cooling region 808 and the heating block 806, and a thermal break 814 between the cooling region 810 and the heating block 806. The thermal breaks 812 and 814 provide a region through which the temperature differences between the cooling region 808 and 810 and the heating block 806 can be provided with a thermal gradient.

Figure 8B:
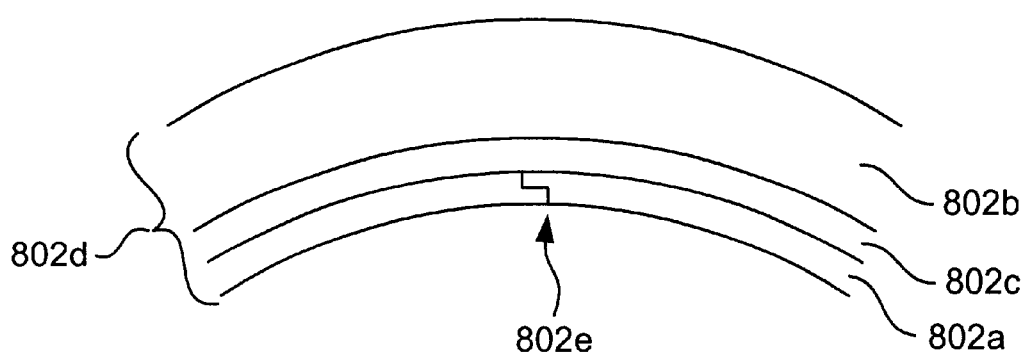
FIG. 8B is a diagram of an alternative construction of a chamber wall of a plasma processing apparatus.

While the wall 802 in FIG. 8A is shown as a single piece, FIG. 8B shows another embodiment where the wall is a sandwich construction 802d. The inner wall element 802a can be made of particular material as suited to the application of the plasma processing chamber. The outer wall element 802b can be any suitable material with physical properties to function as the inner wall support. The outer wall 802a and the bonding material 802c joining the two wall elements 802a and 802b must have reasonable thermal conductivities to allow the temperature control of the inner surface of the inner wall element 802a with the heating and cooling system 800 shown in FIG. 8. The bonding material 802c thickness and composition may be varied to accommodate thermal control performance desired, compensation of mismatches in thermal coefficients of expansion between inner and outer wall materials 802b, 802a. The bonding material 802c thickness and composition may also be varied change the electrical conductivity between the inner and outer wall elements thus allowing an electrically floating inner wall if desired while still controlling the temperature. This construction has a number of other advantages in some situations. The material of the inner wall 802a may be chosen with less concern for the structural requirements of the wall 802 thus allowing expanded choices for the chemical or electrical properties of the material facing the inner volume of the plasma processing chamber. In addition, this allows choices of materials that may not be available in sizes or shapes desired for the wall, but where the material facing the inner volume of the reactor is important. This tiling of inner wall material can be achieved by appropriate shaping of the tiles and placement as shown by a possible joint 802e in FIG. 8B.

The heating and cooling units utilized for the side walls of the plasma processing chamber as shown in FIGS. 7 and 8 do not need to include the notches or slots that were provided in the heating and cooling plate 302, such as illustrated in FIG. 4, because the heating and cooling units utilized for the side walls of the plasma processing chamber do not receive any significant RF coupling from the coils on the vacuum plate that ignite the plasma.

Figure 9:
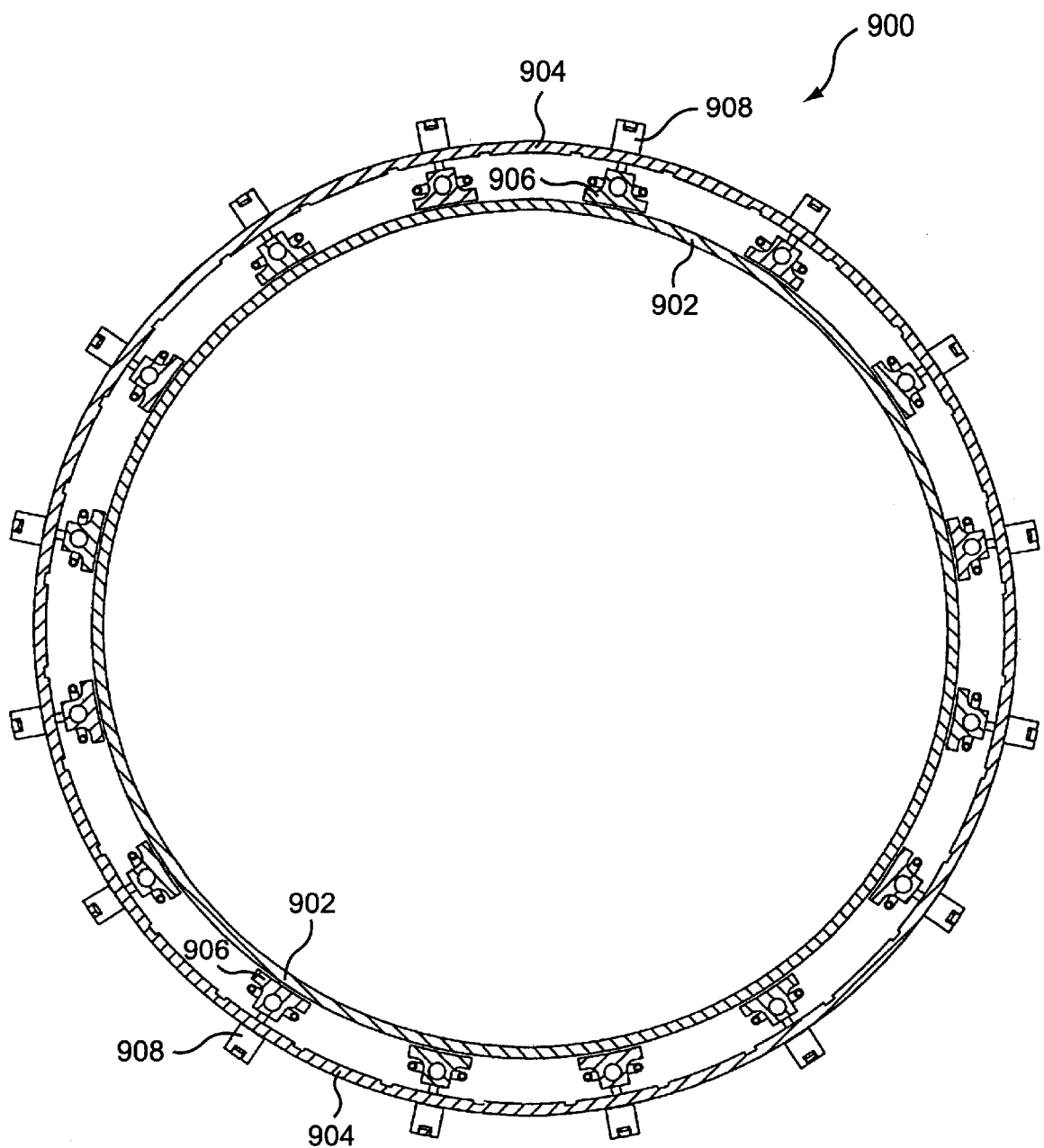
FIG. 9 is a top view of a cross-section of a plasma processing chamber according to one embodiment of the invention.

FIG. 9 is a top view of a cross-section of a plasma processing chamber 900 according to one embodiment of the invention. The plasma processing chamber 900 illustrates a chamber wall 902 and an outer container wall 904. A series of heating and cooling blocks 906 are thermally coupled to the outer surface of the chamber wall 902. As shown in FIG. 9, the heating and cooling blocks 906 can be equidistantly spaced around the periphery of the chamber wall 902. In this embodiment, there are sixteen (16) heating and cooling blocks 906 that are provided to control the temperature of the chamber wall 902. However, it should be recognized that a different number of heating and cooling blocks could easily be provided, particularly if thermal conductivity of the chamber wall 902 is alter significantly or the surface area of the heating and cooling blocks was enlarged. The chamber wall 902 could also be a sandwich or tiled wall construction as shown in FIG. 8B. Further, each of the heating and cooling blocks 906 is biased against the outer surface of the chamber wall 902 by a spring biased pin 908. The spring biased pins 908 are spring biased against to the outer container wall 904 to force the heater blocks 906 against the outer surface of the chamber wall 902. The spring biasing not only improves thermal coupling and repeatability, but also provides easy removability which simplifies repair, maintenance or reconfiguration.

Figure 10:
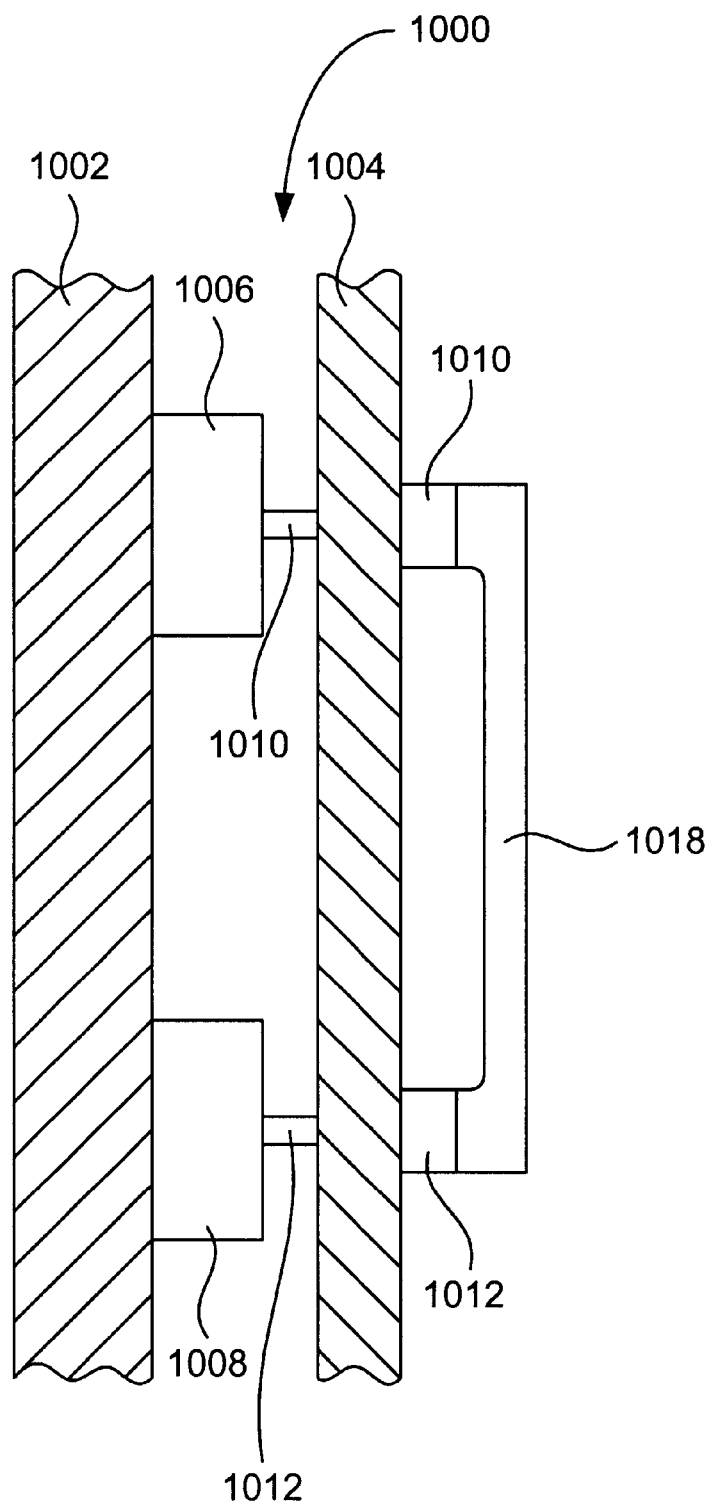
FIG. 10 illustrates a cross-sectional side view of a portion of a plasma processing chamber in which a chamber wall and an outer container wall are provided.
Figure 11:
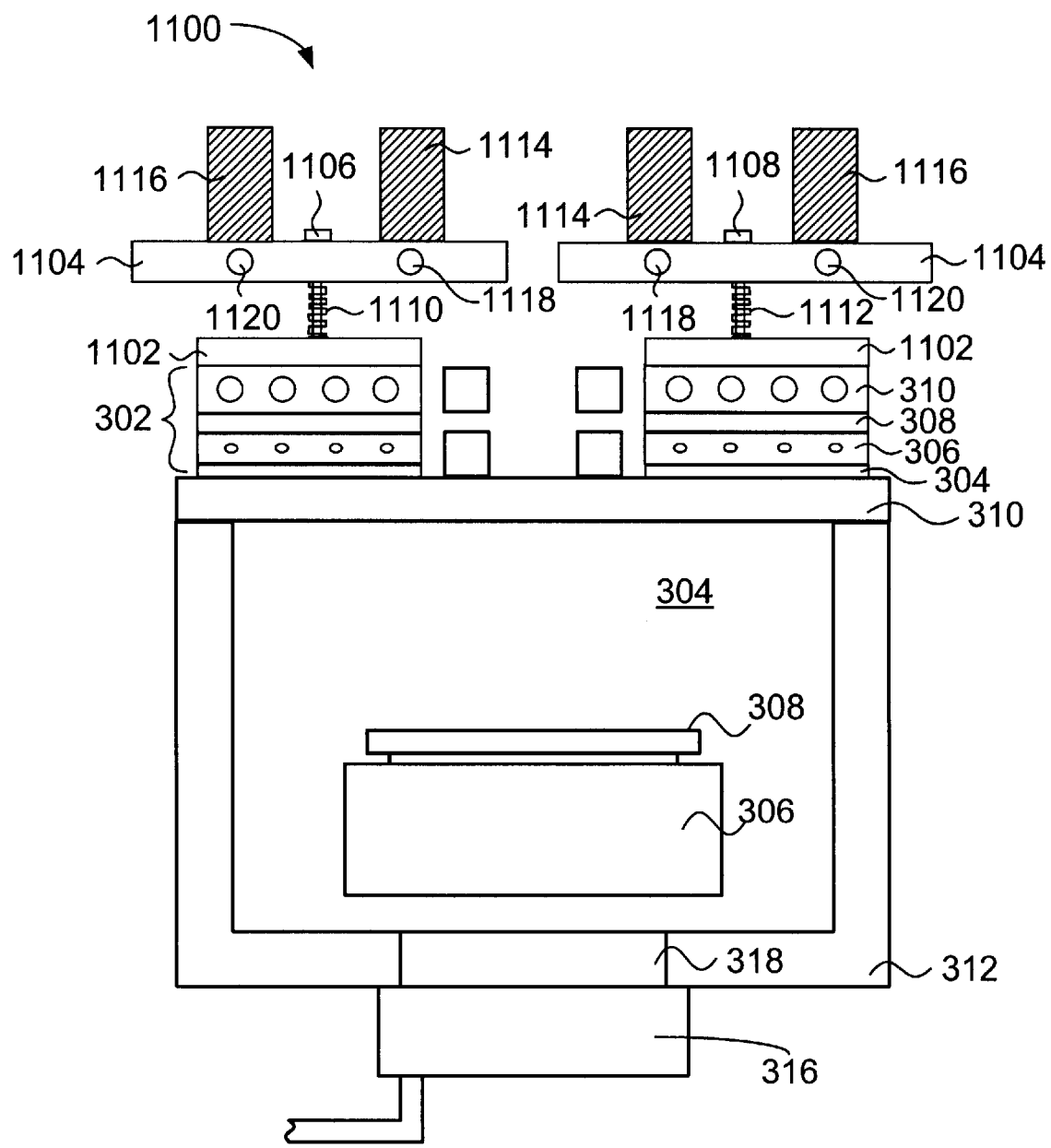
FIG. 11 is a cross-sectional diagram of a plasma processing apparatus according to still another embodiment of the invention.

FIG. 10 illustrates a cross-sectional side view of a portion of a plasma processing chamber 1000 in which a chamber wall 1002 and an outer container wall 1004 are provided. As an example, the chamber wall 1002 and the outer container wall 1004 can be provided similar to the chamber wall 902 and the outer container wall 904 illustrated in FIG. 9. Here, the plasma processing chamber 1000 includes a pair of vertically positioned heating and cooling blocks, namely, heating and cooling blocks 1006 and 1008. Spring biased pins 1010 and 101 2 respectively bias, or force, the heating and cooling blocks 1006 and 1008 against the chamber wall 1002. The spring biased pins 1010 and 1012 act against the outer container wall 1004. In addition, the spring biased pins 1010 and 1012 are coupled to a handle 1018. The handle 1018 allows a technician to easily remove the heating and cooling blocks 1006 and 1008 away from the chamber wall 1002 for maintenance, repair, replacement or other operations to the chamber wall 1002 or the heating and cooling blocks 1006 and 1008 themselves. By pulling back the handle 1018 (away from the outer container wall 1004), the spring biased pins 1010 and 1012 retracted so that the heating and cooling blocks 1006 and 1008 no longer press against the chamber wall 1002 and allow the parts to move relative to each other without scraping for easy removal or service FIG. 11 is a cross-sectional diagram of a plasma processing apparatus 1100 according to still another embodiment of the invention. The plasma processing apparatus 1100 is similar to the plasma processing apparatus illustrated in FIG. 3 in that it includes the heating and cooling plate 302. However, the plasma processing apparatus 1100 includes additional components for cooling other areas of the plasma processing apparatus 1100. In particular, the plasma processing apparatus 1100 includes a cover plate 1102 that is provided over the cooling block 310 of the heating and cooling plate 302. The plasma processing apparatus 1100 also includes a support plate 1104 that has a fixed rigid position with respect to the plasma processing chamber 304. Pins 1106 and 1108 are provided through the support plate 1104 toward the cover plate 1102. Springs 1110 and 1112 are respectively provided with the pins 1106 and 1108 to bias the heating and cooling plate 302 against the outer surface of the vacuum plate 310. In other words, the springs 1110 and 1112 are used to provide a force from the support plate 1104 towards the cover plate 1102 to force the heating and cooling plate 302 against the vacuum plate 310. Still further, the support plate 1104 may also support DC coils 1114 and 1116. The weight of the DC coils may be sufficient to apply enough force to dispense with the pin 1106, 1108 and spring 1110, 1112 arrangements if the support plate 1104 and cover plate 1102 are in contact. The DC coils 1114 and 1116 can be used to alter the plasma distribution within the plasma processing chamber 304 through use of magnetic fields. Additional details on the operation of DC coils and their use with respect to plasma processing apparatus are described in U.S. application Ser. No. 09/439,661 filed concurrently herewith, and entitled IMPROVED PLASMA PROCESSING SYSTEMS AND METHODS THEREFOR, which is hereby incorporated by reference. Further, to cool the DC coils or the support plate 1104 that supports the DC coils 1114 and 1116, the support plate 1104 includes cooling elements 1118 and 1120 that cool the support plate 1104. In one implementation, the cooling elements 1118 and 1120 can be provided by a tube (channel) through which a cooling liquid flows. In this manner, the temperature at which the DC coils 1114 and 1116 operate can be cooled so that they do not overheat during operation and/or so that their temperature can be generally controlled to provide for more uniform operation. In one implementation, for better cooling of the DC coils 1114 and 1116, the cooling elements 1118 and 1120 can be provided directly under the DC coils 1114 and 1116. If the weight of the DC coils 1116, 1114 and support plate 1104 is used to press the heating and cooling plate 302 (temperature control sandwich assembly) against the vacuum plate 310 (temperature controlled surface), it is envisioned that it may be possible to thermally and mechanically substitute the cooled support plate 1104 with cooling elements 1118 and 1120 for the cooling block 310 and cover plate 1102.

The cooling blocks can utilize cooling tubes through which regular water flows to cool the associated surfaces. In one implementation, the temperature of the cooling water is fixed at about 15–20 degrees Celsius and the rate of flow is controlled to increase or decrease the cooling rate by the cooling block.

The thermal break is generally formed of rubber such as silicone rubber. The temperature coefficient for the thermal barrier can be generally in the range of 0.1–2 Watts/m K, and more particularly about 1 Watts/m K. The thermal gasket can also be formed of rubber, such as metal-loaded silicone rubber. However, the thermal gasket is designed to have a higher thermal conductivity (e.g., 4 Watts/m K) so that the heating and cooling plate is better thermally coupled to the surface of the vacuum plate. In this regard, the rubber used for the thermal gasket can be silver loaded to increase its thermal conductivity. The temperature sensors can be provided in numerous places. In one embodiment the temperature sensor is coupled to the outer surface of the vacuum plate for use by the heating and cooling plate, and coupled to the side walls at suitable positions to monitor the temperature for use by the heating and cooling elements.

The present invention is able to control the temperature of the plasma processing chamber on the order of +/−5° Celsius during operation of the plasma processing apparatus. The invention can also provide for smooth spatial temperature distribution about the present processing chamber for use of the appropriately positioned heating and cooling elements.

The plasma processing chamber can be silicon carbide (SiC) which has a good thermal conductivity (e.g., >200

Watts/m K) but is more difficult to heat and cool than metal liners because of thermal expansion issues. The invention is particularly suited to provide temperature control to plasma processing chambers made of silicon carbide. The invention not only supplies the cooling but also supplies heating as needed. The heating and cooling of the plasma processing chamber is beneficially provided from the outside of the plasma processing chamber.

The advantages of the invention are numerous. Different embodiments or implementations may yield one or more of the following advantages. One advantage of the invention is that the invention allows temperature of plasma processing devices to be controlled with substantially increased accuracy and precision. Another advantage of the invention is that both heating and cooling are provided through a common thermal interface. Still another advantage of the invention is that by using a common thermal interface, not only can both cooling and heating be provided, but the resulting temperature profile of the surface being temperature controlled is uniform and smooth. Yet another advantage of the invention is that it is non-invasive and easily removable.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. A plasma processing apparatus, comprising:
   a processing chamber having walls and a lid, the walls and the lid both have an internal surface and an exterior surface, said processing chamber being used to process a substrate using a plasma produced by process gases; and
   a thermal management system thermally coupled to an exterior surface of said processing chamber, said thermal management system including at least one combination heating and cooling block that is controlled to regulate a temperature internal to said processing chamber,
   wherein said at least one combination heating and cooling block is mechanically biased against the exterior surface of said processing chamber.

2. A plasma processing apparatus as recited in claim 1, wherein said combination heating and cooling block is a sandwich structure and comprises:
   a heater element;
   a cooling element; and
   a thermal break element between said heater element and said cooling element.

3. A plasma processing apparatus as recited in claim 2, wherein said heater element is thermally coupled to the exterior surface of said processing chamber, and said cooling element thermally couples to the exterior surface of said processing chamber through said thermal break and said heater element.

4. A plasma processing apparatus as recited in claim 2, wherein said heater element is thermally coupled to the exterior surface of said processing chamber, and said cooling element thermally couples to the exterior surface of said processing chamber and said heater element through said thermal break.

5. A plasma processing apparatus as recited in claim 4, wherein said combination heating and cooling block is thermally coupled to one of the walls of said processing chamber.

6. A plasma processing apparatus as recited in claim 5, wherein the walls of said processing chamber is comprised of a bonded sandwich of materials.

7. A plasma processing apparatus as recited in claim 5, wherein the walls of said processing chamber is comprised of a bonded sandwich of materials formed by tiling.

8. A plasma processing apparatus as recited in claim 4, wherein said combination heating and cooling block is thermally coupled to the lid of said processing chamber.

9. A plasma processing apparatus as recited in claim 8,
   wherein said processing apparatus further comprises an RF coil used to generate RF energy to ignite a plasma, and
   wherein at least one of said heater element and said cooling element include slots to minimize RF coupling from said RF coil.

10. A plasma processing apparatus as recited in claim 2,
    wherein the sandwich structure for said combination heating and cooling block further comprises a conformal gasket, and
    wherein said heater element is thermally coupled to the exterior surface of said processing chamber through said conformal gasket, and said cooling element is thermally coupled to the exterior surface of said processing chamber through said thermal break, said heater element and said conformal gasket.

11. A plasma processing apparatus as recited in claim 1, wherein at least an inner surface of the walls and the lid of said processing chamber are ceramic.

12. A plasma processing apparatus as recited in claim 11, wherein the ceramic is SiC.

13. A plasma processing apparatus as recited in claim 2,
    wherein at least an inner surface of the walls and the lid of said processing chamber are ceramic, and
    wherein said heater element and said cooling element are metal.

14. A plasma processing apparatus as recited in claim 13, wherein said thermal break and said conformal gasket is rubber.

15. A plasma processing apparatus as recited in claim 14, wherein the thermal conductivity of said thermal gasket is significantly greater than the thermal conductivity of said thermal break.

16. A plasma processing apparatus as recited in claim 1, wherein said at least one combination heating and cooling block is spring biased against the exterior surface of said processing chamber.

17. A plasma processing apparatus as recited in claim 1,
    wherein the spring biasing of said at least one combination heating and cooling block is provided by a spring, and
    wherein said at least one combination heating and cooling block can be removed from its thermally coupled position with the exterior surface of said processing chamber by retracting the spring.

18. A semiconductor manufacturing apparatus, comprising:
    a plasma processing chamber formed by walls and a bottom surface;
    a sealing lid removably coupled to a top portion of the walls of said plasma processing chamber;
    an RF powered electrode provided on an upper surface of said sealing lid;
    at least one temperature sensor coupled to said sealing lid or said plasma processing chamber;

a first heating and cooling unit coupled to the upper surface of said sealing lid; and a second heating and cooling unit coupled to an outer surface of the walls of said plasma processing chamber, wherein said first heating and cooling unit is removably mechanically biased against the upper surface of said sealing lid or said second heating and cooling unit is removably mechanically biased against the outer surface of the walls of said plasma processing chamber.

19. A semiconductor manufacturing apparatus as recited in claim 18, wherein said first heating and cooling unit is configured to substantially avoid coupling of RF energy from said RF powered electrode into said first heating and cooling unit.

20. A semiconductor manufacturing apparatus as recited in claim 18, wherein said first heating and cooling unit includes slots to substantially avoid coupling of RF energy from said RF powered electrode into said first heating and cooling unit.

21. A semiconductor manufacturing apparatus as recited in claim 18, wherein each of said first and second heating and cooling units is a sandwich structure and comprises:

a heater element;

a cooling element; and a thermal break element between said heater element and said cooling element.

22. A semiconductor manufacturing apparatus as recited in claim 21, wherein said heater element of said first heating and cooling unit is thermally coupled to an exterior surface of said sealing lid of said plasma processing chamber, and said cooling element of said second heating and cooling unit is thermally coupled to the exterior surface of said sealing lid of said plasma processing chamber through said thermal break and said heater element.

23. A plasma processing apparatus, comprising:

a processing chamber having walls and a lid, the walls and the lid both have an internal surface and an exterior surface, said processing chamber being used to process a substrate using a plasma produced by process gases; and means for regulating a temperature internal to said processing chamber by heating said processing chamber with a heater element when the internal temperature is below a lower target temperature and cooling said processing chamber, through the heater element, with a cooling element when the internal temperature is above an upper target temperature, wherein said means for regulating the temperature is spring biased against the exterior surface of said processing chamber.

24. A combination heating and cooling block having a sandwich construction for use with a processing chamber that processes a substrate using a plasma produced by process gases, said combination heating and cooling block comprises:

a heater element;

a cooling element; and a thermal break element between said heater element and said cooling element, wherein said combination heating and cooling block is removably mechanically biased against an exterior surface of said processing chamber.

25. A combination heating and cooling plate as recited in claim 24, wherein said combination heating and cooling plate comprises:

a conformal gasket attached to said heater element.

26. A combination heating and cooling plate as recited in claim 25, wherein said thermal break is a rubber product, and wherein said heater element and said cooling element are metal.

* * * * *